United States Patent
Jung et al.

(10) Patent No.: US 9,006,723 B2
(45) Date of Patent: Apr. 14, 2015

(54) ORGANIC LIGHT-EMITTING DIODE (OLED) DISPLAY

(71) Applicant: Samsung Display Co., Ltd., Yongin, Gyeonggi-do (KR)

(72) Inventors: Hae-Goo Jung, Yongin (KR); Do-Hyung Ryu, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/043,747

(22) Filed: Oct. 1, 2013

(65) Prior Publication Data

US 2014/0346455 A1 Nov. 27, 2014

(30) Foreign Application Priority Data

May 24, 2013 (KR) .................. 10-2013-0058907

(51) Int. Cl.
*H01L 51/52* (2006.01)

(52) U.S. Cl.
CPC ........ *H01L 51/5243* (2013.01); *H01L 51/5203* (2013.01)

(58) Field of Classification Search
CPC .................. H01L 51/5203; H01L 51/5243
USPC ............................................. 257/40; 438/99
See application file for complete search history.

(56) References Cited

U.S. PATENT DOCUMENTS

| | | | |
|---|---|---|---|
| 7,511,295 B2* | 3/2009 | Kim et al. | 257/40 |
| 2001/0015618 A1* | 8/2001 | Yamazaki et al. | 313/505 |
| 2006/0125407 A1* | 6/2006 | Jeong | 315/169.3 |
| 2007/0216298 A1* | 9/2007 | Kaneko | 313/512 |
| 2012/0026074 A1* | 2/2012 | Lee et al. | 345/76 |
| 2012/0039562 A1 | 2/2012 | Tan et al. | |
| 2012/0146059 A1* | 6/2012 | Moon et al. | 257/88 |
| 2012/0295451 A1 | 11/2012 | Hyun-Jun et al. | |
| 2013/0020967 A1* | 1/2013 | Jung et al. | 315/312 |
| 2013/0126858 A1* | 5/2013 | Boerner et al. | 257/40 |

FOREIGN PATENT DOCUMENTS

| | | |
|---|---|---|
| KR | 10-2011-0005735 A | 1/2011 |
| KR | 10-2011-0007632 A | 1/2011 |
| KR | 10-2012-0129488 A | 11/2012 |

* cited by examiner

*Primary Examiner* — Allan R Wilson
(74) *Attorney, Agent, or Firm* — Knobbe Martens Olson & Bear LLP

(57) ABSTRACT

An organic light-emitting diode (OLED) display is disclosed. In one aspect, the OLED display includes a substrate, an organic light-emitting portion, a sealing member, and first and second connecting members. The organic light-emitting portion includes a first electrode positioned on the substrate, an organic light-emitting layer formed on the first electrode, and a second electrode formed on the organic light-emitting layer. The sealing member includes a first conductive layer positioned on the organic light-emitting portion and electrically connected to the second electrode, a second conductive layer electrically connected to the first electrode, and an insulating layer interposed between the first and second conductive layers. The first connecting member is connected to the first conductive layer to supply a first power source, and the second connecting member is connected to the second conductive layer to supply a second power source.

20 Claims, 4 Drawing Sheets

ORGANIC LIGHT-EMITTING DIODE (OLED) DISPLAY

CROSS-REFERENCE TO RELATED APPLICATIONS

This application claims priority to and the benefit of Korean Patent Application No. 10-2013-0058907, filed on May 24, 2013, in the Korean Intellectual Property Office, the entire contents of which are incorporated herein by reference in their entirety.

BACKGROUND

1. Field

The described technology generally relates to an organic light-emitting diode (OLED) display.

2. Description of the Related Technology

OLED displays produce images using OLEDs that generate light through recombination of electrons and holes. OLED displays generally have fast response times and low power consumption.

In general, OLED displays include a substrate, an organic light-emitting portion including an OLED positioned on the substrate, and a sealing member that, together with the substrate, seals the organic light-emitting portion.

Typically, a power supply pad is formed on a portion of the sealing member, and supplies voltages for driving the organic light-emitting portion to the power supply pad through a film for power supply (FPC). The film for power supply is typically compressed and/or bonded to the power supply pad.

SUMMARY OF CERTAIN INVENTIVE ASPECTS

One inventive aspect is an OLED display capable of reliably supplying power.

Another aspect is an OLED display, including: a substrate; an organic light-emitting portion including a first electrode positioned on the substrate, an organic light-emitting layer formed on the first electrode, and a second electrode formed on the organic light-emitting layer; a sealing member including a first conductive layer positioned on the organic light-emitting portion and electrically connected to the second electrode, a second conductive layer electrically connected to the first electrode, and an insulating layer interposed between the first and second conductive layers; and a first connecting member connected to the first conductive layer to supply a first power source, and a second connecting member connected to the second conductive layer to supply a second power source.

The insulating layer may include a first opening which has a first area and exposes a portion of the first conductive layer. The second conductive layer may include a second opening which has a second area broader than the first area and exposes the first opening and a portion of the insulating layer.

The OLED display may further include first and second pads formed on the sealing member. The first pad includes a third opening which exposes a first contact area through which the first connecting member and the first conductive layer are connected to each other, and the second pad includes a fourth opening which exposes a second contact area through which the second connecting member and the second conductive layer are connected to each other.

The thicknesses of the first and second pads may be different from each other.

Each of the first and second connecting members may include a case body; pin-type first and second terminal portions respectively coupled to opposite side portions of the case body, each terminal portion having an elastic force substantially perpendicular to a lower surface of the case body; and magnetic bodies inserted into the case body disposed in areas corresponding to the first and second pads.

Each of the first and second terminal portions may include two or more terminals.

The terminals may protrude a predetermined height from the case body.

Each of the first and second pads may include coupling holes configured to be respectively coupled to coupling projections protruded from the lower surface from the case body.

Handles may protrude from both sides of the case body.

The sealing member may further include a conductive pattern positioned in the same layer as the first conductive layer, wherein the conductive pattern is insulated from the first conductive layer and electrically connects the second conductive layer to the first electrode.

The sealing member may further include a conductive connection portion positioned in the same layer as the insulating layer, wherein the conductive connection portion electrically connects the conductive pattern to the second conductive layer.

BRIEF DESCRIPTION OF THE DRAWINGS

Exemplary embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the exemplary embodiments to those skilled in the art.

In the drawings, the dimensions of elements may be exaggerated for clarity of illustration. It will be understood that when an element is referred to as being "between" two elements, it may be the only element between the two elements, or one or more intervening elements may also be present. Like reference numerals refer to like elements throughout.

DETAILED DESCRIPTION OF CERTAIN INVENTIVE EMBODIMENTS

Figure 1:
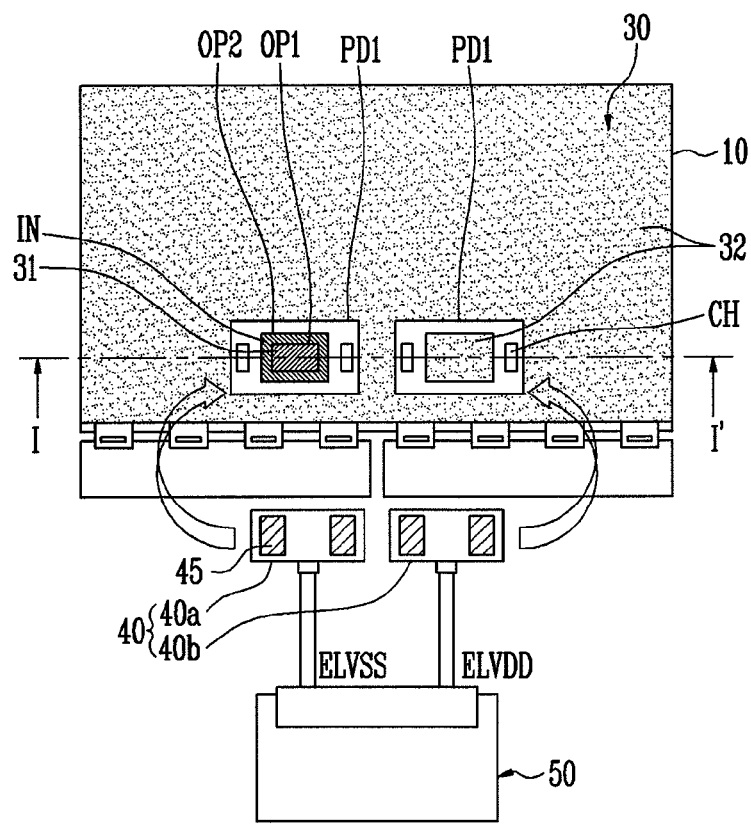
FIG. 1 is a plan view showing an OLED display according to an embodiment of the described technology.

In the following detailed description, only certain exemplary embodiments have been shown and described, simply by way of illustration. As those skilled in the art would realize, the described embodiments may be modified in various different ways, all without departing from the spirit or scope of the described technology. Accordingly, the drawings and description are to be regarded as illustrative in nature and not restrictive. In addition, when an—element is referred to as being "on" another element, it can be directly on the other element or be indirectly on the other element with one or more intervening elements interposed therebetween. Also, when an element is referred to as being "connected to" another element, it can be directly connected to the other element or be indirectly connected to the other element with one or more intervening elements interposed therebetween. Hereinafter, like reference numerals refer to like elements.

Figure 2:
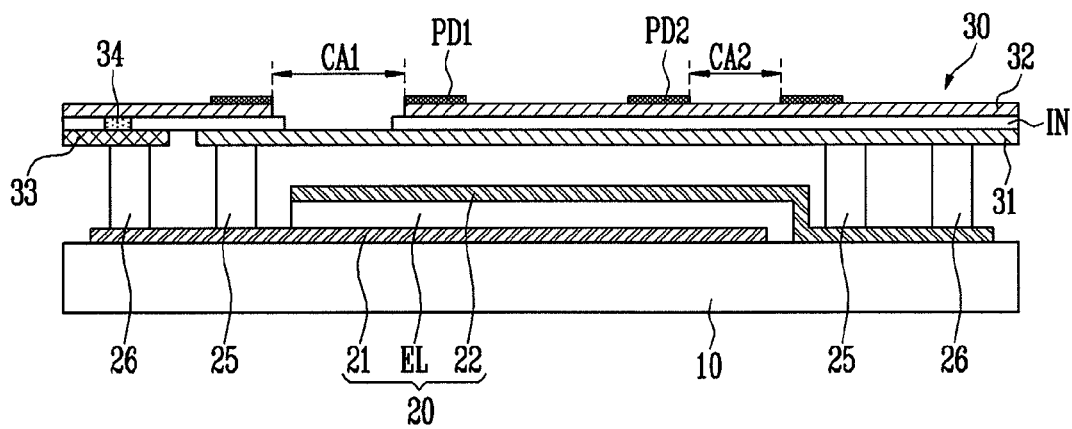
FIG. 2 is a cross-sectional view taken along line I-I' of FIG. 1.

FIG. 1 is a plan view showing an organic light-emitting diode (OLED) display (hereinafter to be interchangeable used with "OLED display") according to an embodiment of the described technology. FIG. 2 is a cross-sectional view taken along line I-I' of FIG. 1.

Referring to FIGS. 1 and 2, the OLED display according to the present embodiment includes a substrate 10, an organic light-emitting portion 20, a sealing member 30 and a connecting member 40.

The substrate 10 may be formed of a transparent insulative material such as a polymer, metal, glass, quartz, etc. In the case where the substrate 10 is formed of a transparent material, an image displayed on the organic light-emitting portion 20 is viewed from outside of the OLED display through the substrate 10.

The organic light-emitting portion 20 includes a first electrode 21 positioned on the substrate 10, an organic light-emitting layer EL formed on the first electrode 21, and a second electrode 22 formed on the organic light-emitting layer EL.

The first electrode 21 may be a hole injection electrode (anode electrode), and the second electrode 22 may be an electron injection electrode (cathode electrode). The organic light-emitting layer EL may include a hole injection layer (HIL), a hole transport layer (HTL), an emissive layer (EML), an electron transport layer (ETL) and an electron injection layer (EIL), which are sequentially laminated on the first electrode 21.

If power is supplied from a power supply portion 50 to the first and second electrodes 21 and 22, holes and electrons are injected into the organic light-emitting layer EL from the respective first and second electrodes 21 and 22, and excitons generated by coupling the holes and the electrons transition from an excited state to a ground state, thereby emitting light.

According to some embodiments, the first electrode 21 may be formed with a transparent conductive layer, and the second electrode 22 may be formed with a reflective conductive layer. The light emitted from the organic light-emitting layer EL is reflected by the second electrode 22 and then emitted through the substrate 10 to the environment. This type of light-emitting structure is referred to as a rear light-emitting type.

For example, the first electrode 21 may be formed with a triple layer of indium tin oxide (TIO)/silver (Ag)/ITO, and the second electrode 22 may include Ag or aluminum (Al). The organic light-emitting layer EL may be made of a low or high molecular organic compound.

Although it has been schematically illustrated in FIG. 2 that the organic light-emitting portion 20 includes three layers, the organic light-emitting portion 20 may include a plurality of pixels, each pixel including a driving circuit portion and an organic light emitting-diode controlled by the driving circuit portion.

Here, one pixel may be defined by a gate line, a data line and a common power line. The driving circuit portion may include a switching thin film transistor, at least two thin film transistors including a driving thin film transistor, and at least one capacitor.

The first electrode 21 may be formed for each pixel, and may be connected to the driving thin film transistor of the corresponding pixel. Contrastingly, the second electrode 22 may be commonly formed over a plurality of pixels.

Meanwhile, a junction layer 25 and a conductive junction layer 26 may be formed between the organic light-emitting portion 20 and the sealing member 30 described below.

The junction layer 25 is positioned to surround the organic light-emitting portion 20 at the outside of the organic light-emitting portion 20. The junction layer 25 may include ultra-violet curing resin or thermosetting resin. For example, the junction layer 25 may include epoxy resin. A moisture absorption filling material (not shown) may be disposed between the substrate 10 and the sealing member 30 at the inside of the junction layer 25.

The conductive junction layer 26 is positioned outside of the junction layer 25, and electrically connects the sealing member 30 to the first electrode 21 and the sealing member 30 to the second electrode 22. The electrical connections of the conductive junction layer 26 will be described in detail below.

The sealing member 30 may seal the organic light-emitting portion 20 including the organic light-emitting diode. The sealing member 30 may be formed using a roll-to-roll process and a trimming process.

The sealing member 30 is positioned on the organic light-emitting portion 20, and includes a first conductive layer 31 electrically connected to the second electrode 22, a second conductive layer 32 electrically connected to the first electrode 21, and an insulating layer IN interposed between the first and second conductive layers 31 and 32. The sealing member 30 may further include a conductive pattern 33 and a conductive connection portion 34.

The first conductive layer 31 is electrically connected to the second electrode 22 through the conductive junction layer 26. The first conductive layer 31 may include various conductive metals such as copper, platinum, gold, silver, nickel, tin, and aluminum, or a conductive polymer, etc.

The conductive pattern 33 may be positioned in the same layer as the first conductive layer 31 while being electrically insulated from the first conductive layer 31. The conductive pattern 33 is electrically connected to the first electrode 21 through the conductive junction layer 26.

The insulating layer IN may be positioned between the first and second conductive layers 31 and 32. The insulating layer IN is coupled to the first and second conductive layers 31 and 32 by being interposed therebetween.

The insulating layer IN may be made of resin such as polyethylene terephthalate (PET), polyimide (PI) or polycarbonate (PC). The insulating layer IN may have a higher bending strength compared to the first and second conductive layers 31 and 32. As such, the insulating layer IN supports the first and second conductive layers 31 and 32 due to its higher bending strength, so as to reinforce the first and second conductive layers 31 and 32. Thus, it may be possible to minimize deformation of the sealing member 30, caused by external forces.

The insulating layer IN includes a first opening OP1 which has a first area and exposes a portion of the first conductive layer 31. The first opening OP1 may be formed using a punching process.

The conductive connection portion 34 may be positioned in the same layer as the insulating layer IN and passes through the insulating layer IN. The conductive connection portion 34 electrically connects the conductive pattern 33 to the second conductive layer 32.

The second conductive layer 32 may be positioned on the insulating layer IN, and is electrically connected to the first electrode 21 through the conductive connection portion 34, the conductive pattern 33 and the conductive junction layer 26. The second conductive layer 32 may include various conductive metals such as copper, platinum, gold, silver, nickel, tin and aluminum, or a conductive polymer, etc.

The second conductive layer 32 includes a second opening OP2 which may have a second area broader than the first area of the first opening OP1 in the insulating layer IN and exposes the first opening OP1 and a portion of the insulating layer IN. The second opening OP2 may be formed using a punching process.

Here, the second opening OP2 has an area broader than that of the first opening OP1 in the insulating layer IN, so that it is possible to prevent an unintentional short circuit between the first and second conductive layers 31 and 32.

In other embodiments, the second opening OP2 in the second conductive layer 32 may have substantially the same area as the first area of the first opening OP1 in the insulating layer IN.

The connecting member 40 may be positioned on the sealing member 30. In this case, one end of the connecting member 40 is electrically connected to the organic light-emitting portion 20 through the first or second conductive layers 31 or 32 of the sealing member 30. The other end of the connecting member 40 is connected to the power supply portion 50 positioned outside of the substrate 10 to apply the power from the power supply portion 50 to the organic light-emitting portion 20.

First and second power sources ELVSS and ELVDD having different voltage levels may be supplied to the organic light-emitting portion 20. Accordingly, the connecting member 40 includes a first connecting member 40a connected to the first conductive layer 31 to supply the first power source ELVSS, and a second connecting member 40b connected to the second conductive layer 32 to supply the second power source ELVDD.

Meanwhile, certain areas of the sealing member 30 may be designated as a first contact area CA1 connected to the first connecting member 40a and a second contact area CA2 connected to the second connecting member 40b.

Although it has been described that the first and second contact areas CA1 and CA2 are positioned in a central area of the upper surface of the sealing member, the present invention is not limited thereto. That is, the first and second contact areas CA1 and CA2 may alternatively be positioned at an edge area of the sealing member 30.

According to some embodiments, the OLED display may further include first and second pads PD1 and PD2 formed on the sealing member 30. Here, the first contact area CA1 is defined by an opening in the first pad PD1 and the first connecting member 40a is electrically connected to the first conductive layer 31 through the first contact area CA1. Similarly, the second contact area CA2 is defined by an opening in the second pad PD2 and the second connecting member 40b is electrically connected to the second conductive layer 32 through the second contact area CA2.

Here, the first contact area CA1 of the first pad PD1 may have the same area as the second area of the second opening OP2 in the second conductive layer 32. The first and second pads PD1 and PD2 may have the same shape.

According to one embodiment, a magnetic body 45 is inserted into each of the first and second connecting members 40a and 40b, and the first and second pads PD1 and PD2 are formed of an iron material. Thus, the connection between the connecting members and the contact areas can be maintained by the attraction between the magnetic body 45 and the iron material.

In another embodiment, the first or second pad PD1 or PD2 may include a magnetic body having the opposite polarity as that of the magnetic body 45 included in the first or second connecting member 40a or 40b. The first or second pad PD1 or PD2 may be formed of another material having a separate structure that provides an attractive magnetic force.

The first connecting member 40a is supported by the first pad PD1, using the magnetic force generated by the magnetic body 45. The first connecting member 40a may be connected to the first conductive layer 31 through the first and second openings OP1 and OP2.

The first power source ELVSS supplied from the power supply portion 50 is applied to the first conductive layer 31 through the first connecting member 40a. The first power source ELVSS supplied to the first conductive layer 31 is supplied to the second electrode 22 through the conductive junction layer 26 electrically connected to the first conductive layer 31. The first connecting member 40a may be electrically connected to any portion of the first conductive layer 31.

According to an embodiment, in the case where the sealing member 30 is formed of a flexible metal sheet or a flexible metal film, the organic light-emitting portion 20 and the sealing member 30 may be structured so that the organic light-emitting portion 20 and the sealing member 30 are directly adhered to each other without using the junction layer 25 or the conductive junction layer 26. In this case, the first conductive layer 31 and the second electrode 22 come into surface contact with each other and thus can be electrically connected to each other without using a separate conductive material.

The second connecting member 40b is supported by the second pad PD2, using a magnetic force generated by the magnetic body 45. The second connecting member 40b is connected to the second conductive layer 32.

The second power source ELVDD supplied from the power supply portion 50 is applied to the second conductive layer 32 through the second connecting member 40b. The second power source ELVDD supplied to the second conductive layer 32 is supplied to the first electrode 21 through the conductive connection portion 34, the conductive pattern 33 and the conductive junction layer 26. The second connecting member 40b may be electrically connected to any portion of the second conductive layer 32.

According to an embodiment, in the case where the sealing member 30 is formed of a flexible metal sheet or flexible metal film, the junction layer 25 and the conductive junction layer 26 may be omitted. The conductive pattern 33 and a portion of the exposed edge of the first electrode 21 are adhered to each other, so that the conductive pattern 33 and the first electrode 21 can be electrically connected to each other.

As described above, according to at least one embodiment, the first and second power sources ELVSS and ELVDD are supplied to the first and second electrodes 21 and 22 through the first and second connecting members 40a and 40b respectively connected to the sealing member 30. Hence, it is unnecessary to use a film for power supply, which may crack if the OLED display is bent. It is also unnecessary to use a film compressing process which may cause damage to a panel of the OLED display.

Figure 3A:
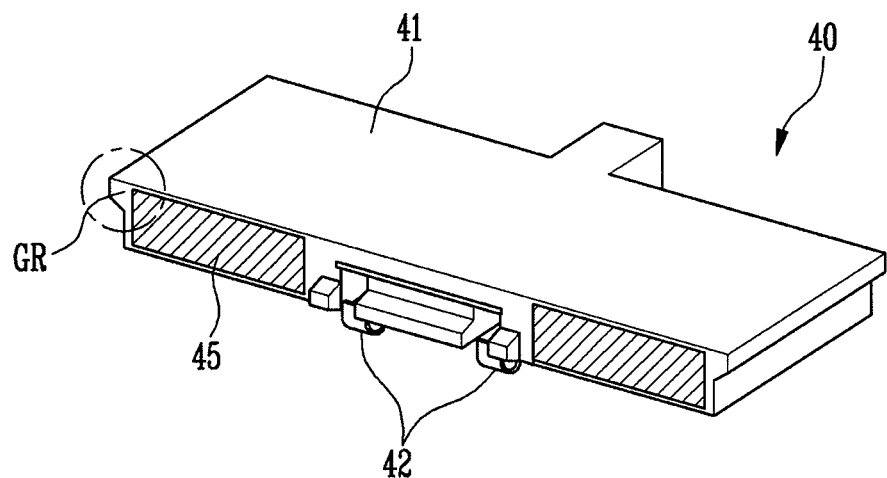
FIGS. 3A and 3B are perspective views showing a connecting member of FIG. 1.
Figure 3B:
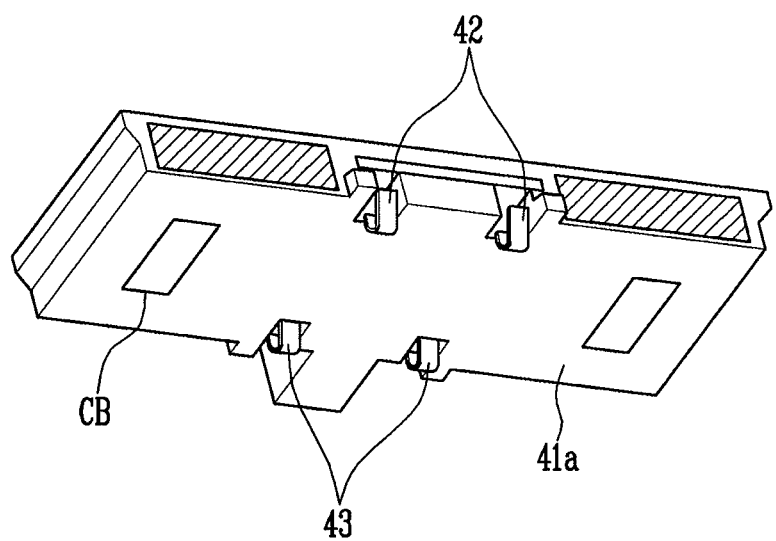
Figure 4A:
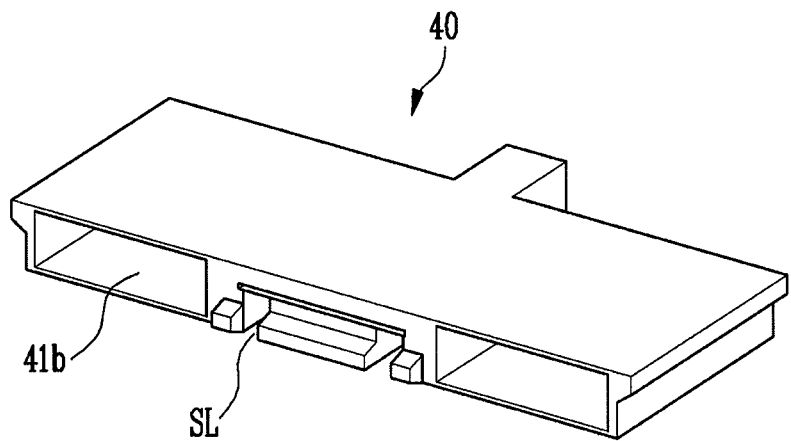
FIGS. 4A to 4D are exploded perspective views of the connecting member.
Figure 4B:
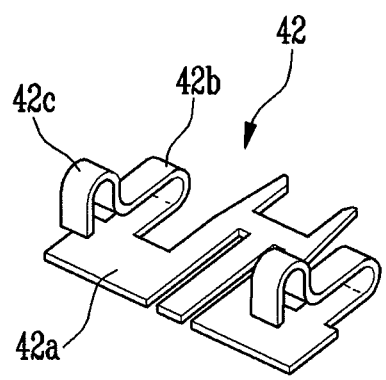
Figure 4C:
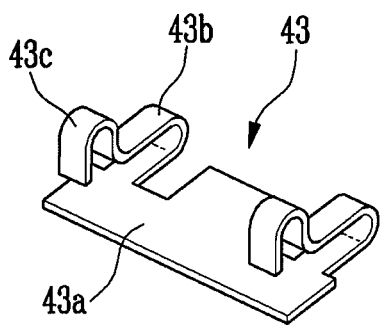
Figure 4D:
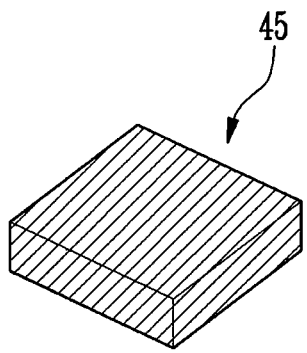

FIGS. 3A and 3B are perspective views showing the connecting member of FIG. 1. FIG. 4 is an exploded perspective view of the connecting member.

Referring to FIGS. 3A, 3B and 4, the connecting member 40 according to the present embodiment may include a case body 41, a first terminal portion 42, a second terminal portion 43 and magnetic bodies 45. The first and second connecting members 40a and 40b described above have the same structure and shape. Therefore, the first and second connecting members 40a and 40b will be commonly referred to as the connecting member 40.

The case body 41 has may be formed in the shape of a substantially quadrangular connector. The case body 41 may be formed of an insulating material such as plastic, which is light and can be easily manufactured.

Specifically, accommodating spaces 41b are respectively positioned at both left and right sides of the case body 41, and a portion of each side may be opened so that the magnetic bodies 45 may be inserted into the accommodating spaces 41b. In addition, slits SL may be formed at the front and rear sides of the case body so that the first and second terminal portions 42 and 43 may be inserted into the slits SL.

That is, the magnetic bodies 45 may be respectively accommodated in the accommodating spaces 41b at the sides of the case body 41, and the first and second terminal portions 42 and 43 may be positioned at the central portion between the magnetic bodies 45.

Also, protruding portions which may be used as handles are respectively provided at both sides of the case body 41, thereby improving the ease of assembly.

Additionally, coupling projections CB protrude from a lower surface 41a of the case body 41 and are respectively inserted and coupled into coupling holes CH formed in the first and second pads PD1 and PD2. Thus, the coupling projections CB assist in alignment so that the connecting member 40 is not abnormally coupled.

The first and second terminal portions 42 and 43 may be formed as pin-type terminals which are respectively coupled to opposite sides of the case body 41 and produce an elastic force substantially perpendicular to the lower surface 41a of the case body 41.

Specifically, the first terminal portion 42 may include a terminal portion body 42a inserted into the slit SL of the case body 41, a bending portion 42b extended from the terminal portion body 42a to provide the elastic force, and two or more terminals 42c formed at end portions of the bending portion 42b.

The first terminal portion 42 may be formed of a conductive metal material, and the terminal portion body 42a, the bending portion 42b and the terminals 42c may be integrally formed. A portion extending from the terminal portion body 42a is bent in a U-shape so as to form the bending portion 42b. The end portion of the bending portion 42b is bent so as to protrude a predetermined height from the lower surface 41a of the case body 41 and to form the terminals 42c which may elastically contact the contact area of the sealing member 30.

The second terminal portion 43 may be formed of substantially the same material, shape and structure as that of the first terminal portion 42. However, the second terminal portion 43 may have a slightly different shape when necessary.

The magnetic bodies 45 have a substantially quadrangular shape, and are inserted into the case body 41. The magnetic bodies 45 are disposed in areas corresponding to the first and second pads PD1 and PD2, respectively. That is, the magnetic bodies 45 and the pads PD1 and PD2 provide an attractive force therebetween. Hence, the magnetic bodies 45 and the pads PD1 and PD2 may be formed to have the same areas in positions corresponding to each other.

According to at least one embodiment, the OLED display uses the connecting member 40 including the elastic pin-type terminals to facilitate the assembly and attachment/detachment of the panel.

Figure 5:
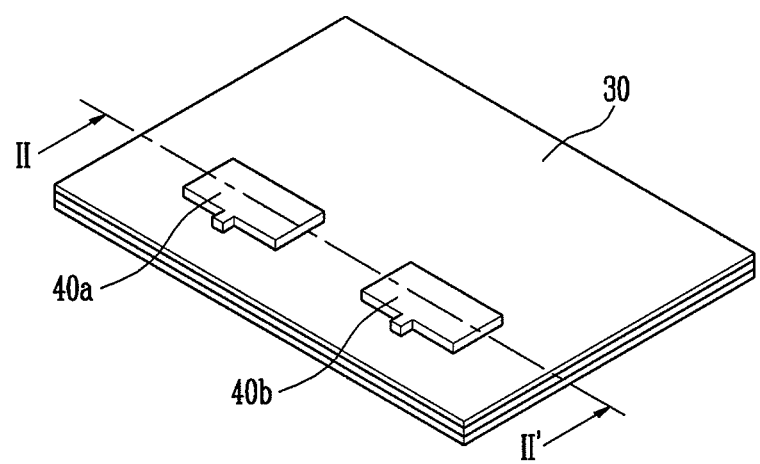
FIG. 5 is a perspective view showing a sealing member to which first and second connecting members are connected.
Figure 6:
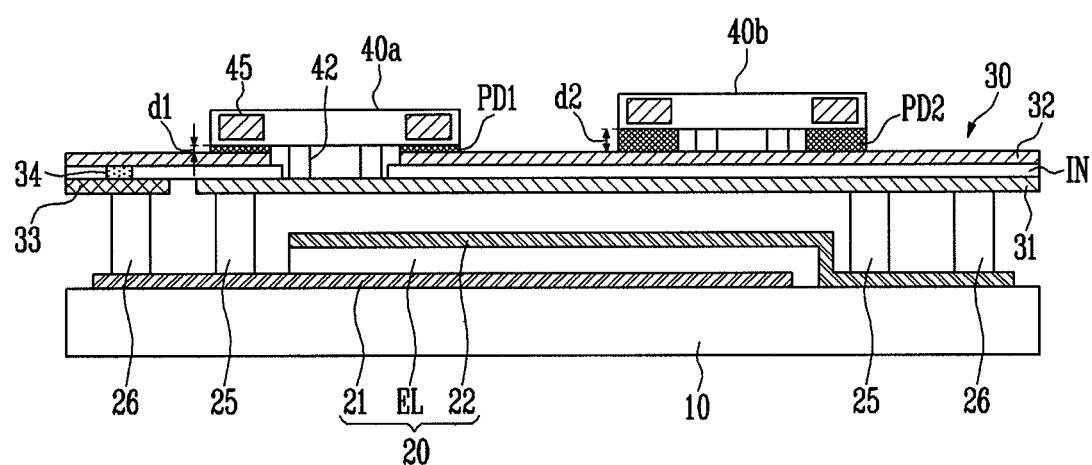
FIG. 6 is a cross-sectional view taken along line II-II' of FIG. 5.

FIG. 5 is a perspective view showing the sealing member to which the first and second connecting members are connected. FIG. 6 is a cross-sectional view taken along line II-II' of FIG. 5.

Referring to FIGS. 5 and 6, the connecting member 40 is connected to the pads PD1 and PD2 by the magnetic attraction between the pads PD1 and PD2 and to the magnetic bodies 45 inserted into the connecting member 40, thereby maintaining the coupling between the connecting member 40 and the pads PD1 and PD2.

If the connecting member 40 is close to the first and second pads PD1 and PD2, the terminal portion 42 is bent as the connecting member 40 is attached to the first and second pads PD1 and PD2 due to the magnetic force. If the connecting portion 40 is moved away from the first and second pads PD1 and PD2 to a predetermined distance, the connecting portion 40 is easily separated from the first and second pads PD1 and PD2 due to the elastic force of the terminal portion 42, and thus the original form of the terminal portion 42 may be recovered.

According to an embodiment, the thicknesses of the first and second pads PD1 and PD2 may be different from each other. Specifically, the first thickness d1 of the first pad PD1 may be less than the second thickness d2 of the second pad PD2.

The first connecting member 40a may be connected to the first conductive layer 31 through the first and second openings OP1 and OP2, however, the second connecting member 40b is directly connected to the second conductive layer 32 on the upper surface of the sealing member 30. Therefore, the amount of deformation of the terminal portion 42 may be increased. Accordingly, the elastic force of the terminal portion 42 may be lost, and the contact portion of the terminal portion 42 may be damaged.

Thus, the second thickness d2 of the second pad PD2 may be greater than the first thickness d1 of the first pad PD1 in consideration of the range of motion of the terminal portion 42, thereby maintaining the connection stability of the second connecting member 40b.

That is, the range of motion of the terminal portion 42 in the connecting member 40 may be limited by adjusting the thicknesses of the first and second pads PD1 and PD2, in order to prevent deformation of the terminal portion 42 in the connecting member 40 and to maintain the reliability of the connecting member 40.

By way of summation and review, in the case where a film for power supply is bonded or soldered to a power supply pad in an OLED display, cracks may occur if the film for power supply is bent, or a panel of the OLED display may be damaged during a compression process performed on the film for power supply.

According to at least one embodiment, a connecting member which may be connected to the sealing member using magnetic bodies is provided, making the use of a film for power supply unnecessary, and thus it is possible to supply power without performing a process of compressing the film which may damage the panel.

Further, according to at least one embodiment, a connecting member including elastic pin-type terminals is provided, so that it is possible to facilitate the assembly and attachment/detachment of the panel. In addition, according to at least one embodiment, it is possible to prevent deformation of the terminal portion of the connecting member and to maintain the reliability of the connecting member.

Exemplary embodiments have been disclosed herein, and although specific terms are employed, they are used and are to be interpreted in a generic and descriptive sense only and are not intended to limit the described technology. In some instances, as would be apparent to one of ordinary skill in the art as of the filing of the present application, features, characteristics, and/or elements described in connection with a particular embodiment may be used alone or in combination with features, characteristics, and/or elements described in connection with other embodiments unless otherwise specifically indicated. Accordingly, it will be understood by those of skill in the art that various modifications in form and detail may be made without departing from the spirit and scope of the described technology as set forth in the accompanying claims.

What is claimed is:

1. An organic light-emitting diode (OLED) display, comprising:
   a substrate;
   an organic light-emitting portion comprising a first electrode formed over the substrate, an organic light-emitting layer formed over the first electrode, and a second electrode formed over the organic light-emitting layer;
   a sealing member comprising: i) a first conductive layer formed over the organic light-emitting portion and electrically connected to the second electrode, ii) a second conductive layer electrically connected to the first electrode, and iii) an insulating layer interposed between the first and second conductive layers, wherein the first conductive layer and the second conductive layer are formed on different layers;
   a first connecting member electrically connected to the first conductive layer to supply a first power source; and
   a second connecting member electrically connected to the second conductive layer to supply a second power source.

2. The OLED display of claim 1, wherein the insulating layer comprises a first opening which has a first area and exposes a portion of the first conductive layer, and wherein the second conductive layer includes a second opening which has a second area larger than the first area and exposes the first opening and a portion of the insulating layer.

3. The OLED display of claim 2, further comprising:
   first and second pads formed on the sealing member,
   wherein the first pad comprises a third opening which exposes a first contact area through which the first connecting member and the first conductive layer are electrically connected to each other, and wherein the second pad comprises a fourth opening which exposes a second contact area through which the second connecting member and the second conductive layer are electrically connected to each other.

4. The OLED display of claim 3, wherein the thicknesses of the first and second pads are different from each other.

5. The OLED display of claim 3, wherein each of the first and second connecting members comprises:
   a case body;
   pin-type first and second terminal portions respectively coupled to side portions of the case body, wherein the first and second terminal portions have an elastic force substantially perpendicular to a lower surface of the case body; and
   a plurality of magnetic bodies inserted into the case body disposed in areas corresponding to the first and second pads.

6. The OLED display of claim 5, wherein each of the first and second terminal portions includes a plurality of terminals.

7. The OLED display of claim 6, wherein the terminals protrude a predetermined height from the case body.

8. The OLED display of claim 5, wherein each of the first and second pads includes a plurality of coupling holes configured to be respectively coupled to a plurality of coupling projections which protrude from the lower surface of the case body.

9. The OLED display of claim 5, further comprising a plurality of handles protruding from sides of the case body.

10. The OLED display of claim 1, wherein the sealing member further comprises:
    a conductive pattern positioned in the same layer as the first conductive layer, wherein the conductive pattern is electrically insulated from the first conductive layer and is configured to electrically connect the second conductive layer to the first electrode.

11. The OLED display of claim 10, wherein the sealing member further comprises:
    a conductive connection portion positioned in the same layer as the insulating layer, wherein the conductive connection portion is configured to electrically connect the conductive pattern to the second conductive layer.

12. A display device, comprising:
    a substrate;
    an organic light-emitting portion comprising i) first and second electrodes formed over the substrate and ii) an organic light-emitting layer interposed between the first and second electrodes;
    a first conductive layer formed over the organic light-emitting portion and electrically connected to the second electrode;
    a second conductive layer electrically connected to the first electrode, wherein the first conductive layer and the second conductive layer are formed on different layers;
    an insulating layer interposed between the first and second conductive layers;
    a first connecting member electrically connected to the first conductive layer to supply a first power source; and
    a second connecting member electrically connected to the second conductive layer to supply a second power source.

13. The display device of claim 12, wherein the insulating layer comprises a first opening which has a first area and exposes a portion of the first conductive layer, and wherein the second conductive layer includes a second opening which has a second area at least as large as the first area and exposes the first opening.

14. The display device of claim 13, further comprising:
    first and second pads formed over the second conductive layer,
    wherein the first pad comprises a third opening which exposes a first contact area through which the first connecting member and the first conductive layer are electrically connected to each other, and wherein the second pad comprises a fourth opening which exposes a second contact area through which the second connecting member and the second conductive layer are electrically connected to each other.

15. The display device of claim 14, wherein the thicknesses of the first and second pads are different from each other.

16. The display device of claim 14, wherein each of the first and second connecting members comprises:
    a case body;
    pin-type first and second terminal portions respectively coupled to side portion of the case body, wherein the first and second terminal portions have an elastic force substantially perpendicular to a lower surface of the case body; and a plurality of magnetic bodies inserted into the case body disposed in areas corresponding to the first and second pads.

17. The display device of claim 16, wherein each of the first and second terminal portions includes a plurality of terminals.

18. The display device of claim 17, wherein the terminals protrude a predetermined height from the case body.

19. The display device of claim 16, wherein each of the first and second pads includes a plurality of coupling holes configured to be respectively coupled to a plurality of coupling projections which protrude from the lower surface of the case body.

20. The display device of claim 16, further comprising a plurality of handles protruding from sides of the case body.

* * * * *